(12) United States Patent
Liu et al.

(10) Patent No.: US 11,953,456 B2
(45) Date of Patent: Apr. 9, 2024

(54) METHOD FOR SEPARATING OIL-WATER TWO-PHASE NMR SIGNALS BY USING DYNAMIC NUCLEAR POLARIZATION

(71) Applicant: Innovation Academy For Precision Measurement Science And Technology, Chinese Academy of Sciences, Wuhan (CN)

(72) Inventors: Chaoyang Liu, Wuhan (CN); Junfei Chen, Wuhan (CN); Li Chen, Wuhan (CN); Jiwen Feng, Wuhan (CN); Zhen Zhang, Wuhan (CN); Zhekai Zhang, Wuhan (CN); Fang Chen, Wuhan (CN)

(73) Assignee: Innovation Academy for Precision Measurement Science and Technology, Chinese Academy of Sciences, Wuhan (CN)

( * ) Notice: Subject to any disclaimer, the term of this patent is extended or adjusted under 35 U.S.C. 154(b) by 140 days.

(21) Appl. No.: 17/520,263

(22) Filed: Nov. 5, 2021

(65) Prior Publication Data
US 2022/0057347 A1 Feb. 24, 2022

Related U.S. Application Data

(63) Continuation of application No. PCT/CN2020/085478, filed on Apr. 18, 2020.

(30) Foreign Application Priority Data

May 8, 2019 (CN) .......................... 201910380283.X

(51) Int. Cl.
   *G01N 24/08* (2006.01)
(52) U.S. Cl.
   CPC ......... *G01N 24/081* (2013.01); *G01N 24/082* (2013.01)

(58) Field of Classification Search
   CPC ...... G01N 24/081; G01N 24/082; G01N 1/38; G01N 24/12; Y02A 90/30; G01R 33/448; G01R 33/62
   See application file for complete search history.

(56) References Cited

U.S. PATENT DOCUMENTS 5,310,539 A * 5/1994 Williams ............... A61K 51/06
                                                    424/9.34
2016/0047762 A1  2/2016 Krioutchkov et al.
(Continued)

FOREIGN PATENT DOCUMENTS

CN        1763563 A    4/2006
CN      101915716 A   12/2010
(Continued)

OTHER PUBLICATIONS

Franck, J.M., et al., "Overhauser Dynamic Nuclear Polarization-Enhanced NMR Relaxometry," Microporous Mesoporous Mater., vol. 178, pp. 113-118 (Apr. 2013).
(Continued)

*Primary Examiner* — Jay Patidar
(74) *Attorney, Agent, or Firm* — Mei & Mark LLP; Manni Li

(57) ABSTRACT

A method for separating oil-water two-phase NMR signals by using dynamic nuclear polarization comprising: using a combination of a non-selective free radical and a selective relaxation reagent to selectively enhance an NMR signal of an oil phase or a water phase, the relaxation reagent being capable of selectively suppressing dynamic polarization enhancement of the water phase or oil phase, thus achieving the polarization enhancement of a single fluid phase in the mixed fluid phases and realizing separation of the two-phase signals; or using a selective free radical to selectively enhance the NMR signal of the oil phase or the water phase, thus achieving the polarization enhancement of a single fluid
(Continued)

phase in the mixed fluid phases and realizing separation of the oil-water two-phase NMR signals. The method is simple and easy to operate, has a short test time, and can efficiently separate NMR signals of oil and water phases.

4 Claims, 4 Drawing Sheets

(56) References Cited

U.S. PATENT DOCUMENTS

2018/0003654 A1* 1/2018 Chen .................. G01V 3/14
2018/0340997 A1 11/2018 Ibragimova et al.

FOREIGN PATENT DOCUMENTS

CN 106324008 A 1/2017
CN 108918573 A 11/2018
WO WO-2009029241 A1 * 3/2009 ........... G01R 33/282

OTHER PUBLICATIONS

Zhou, Jianwei et al., "Dynamic Nuclear Polarizaiton NMR Spectroscopy," Physics, vol. 25, No. 3, pp. 160-166 (Dec. 31, 1996).

* cited by examiner

METHOD FOR SEPARATING OIL-WATER TWO-PHASE NMR SIGNALS BY USING DYNAMIC NUCLEAR POLARIZATION

CROSS-REFERENCE TO RELATED APPLICATIONS

The subject application is a continuation of PCT/CN2020/085478 filed on Apr. 18, 2020, which claims priority on Chinese Application No. CN201910380283.X filed on May 8, 2019 in China. The contents and subject matter of the PCT international application and the Chinese priority application are incorporated herein by reference.

BACKGROUND OF THE INVENTION

Technical Field

The invention belongs to the technical field of nuclear magnetic resonance applications, and particularly relates to a method for separating oil-water two-phase NMR signals by using dynamic nuclear polarization.

Description of Related Art

With the rapid development of the world economy and the rapid consumption of petroleum and gas resources on a global scale, the demand for petroleum and gas is rising sharply. The demand for increasing the petroleum recovery rate and developing new and efficient petroleum and gas detection and exploration methods is becoming more and more urgent. Porous medium materials such as geological reservoirs are rich in petroleum and gas resources, which provide new possibilities for solving the increasingly tense contradiction between supply and demand. Methods for evaluating the reservoir content, exploring the petroleum and gas resources in the reservoirs, and improving the petroleum recovery rate, etc., need to understand the reservoir structure, wettability, and the laws of displacement and seepage of different fluid phases in the reservoirs, and the study of the above-mentioned scientific issues relies on the distinction of different fluid phases in the material.

As an important tool for analyzing the structure and characteristics of materials, NMR provides a new research method for studying oil, gas, and water in reservoir rocks. High-field chemical shift spectroscopy can effectively distinguish different fluids. However, due to the influence of an internal magnetic field gradient and magnetic field inhomogeneity caused by the difference in magnetic susceptibility between solid and liquid phases, the high-field chemical shift spectroscopy has a limited resolution when applied to the analysis of porous materials such as cores. In order to reduce the influence of the internal magnetic field gradient, the analysis and testing of porous materials are often carried out at low-field to distinguish different fluids based on the difference in relaxation and diffusion characteristics of different fluids. Due to differences of porous materials in structural heterogeneity, fluid type and distribution, the relaxation or diffusion of different fluids show similar distributions. Different fluid phases cannot be effectively distinguished only based on the 1D (dimension) relaxation or diffusion characterization. Compared with 1D methods, 2D NMR methods such as relaxation-relaxation, relaxation-diffusion, relaxation-gradient can provide more information and distinguish different fluid phases with the same relaxation or diffusion characteristics. Limited by relatively low sensitivity, the time of low-field NMR testing is relatively long, and the time of 2D NMR testing even takes 3 to 4 hours.

In addition, the NMR data measured by the 1D or 2D low-field NMR method need to undergo data processing such as Laplace inversion to obtain a corresponding relaxation distribution or diffusion characteristics. The processing of NMR signals is mathematically uncertain. A low signal-to-noise ratio will broadens the relaxation distribution, and even the distribution of trace components is directly invisible. In order to improve the reliability of a core test and shorten the analysis and test cycle at low-field, it is desired to develop a novel test and analysis method.

BRIEF SUMMARY OF THE INVENTION

In view of the above-mentioned problems in the prior art, the invention provides a method for separating oil-water two-phase NMR signals by using dynamic nuclear polarization. The method is simple and easy to operate, needs a short test time, and can efficiently separate oil-water two-phase NMR signals.

A technical solution adopted to achieve the above-mentioned objective of the invention is as follows.

A method for separating oil-water two-phase NMR signals by using dynamic nuclear polarization, including: adding a free radical for enhancing an NMR signal of a water phase or an oil phase to a to-be-tested oil-water sample, and then performing the measurements of dynamic nuclear polarization enhanced nuclear magnetic resonance to obtain an NMR signal of the water phase or oil phase.

The free radical is a non-selective free radical that is able to simultaneously enhance NMR signals of both the water phase and the oil phase. If only the NMR signal of the water phase needs to be enhanced, a relaxation reagent that is able to enhance relaxation of the oil phase is added. If only the NMR signal of the oil phase needs to be enhanced, a relaxation reagent that is able to enhance relaxation of the water phase is added.

The free radical is a selective free radical that is able to enhance the NMR signal of the water phase or the oil phase. If the NMR signal of the water phase needs to be separated, a selective free radical that is able to enhance the NMR signal of the water phase is added. If the NMR signal of the oil phase needs to be separated, a selective free radical that is able to enhance the NMR signal of the oil phase is added.

Compared with the prior art, the invention has the following beneficial effects and advantages.

1. In response to the need for oil-water two-phase NMR signal separation, the invention adopts a combination of a free radical and a relaxation reagent. The free radical is used for enhancing an NMR signal of a fluid phase, and the relaxation reagent is used for enhancing relaxation of an unselected fluid phase. The NMR signal of the desired fluid phase is selectively enhanced, and the NMR signal of the unselected fluid phase is suppressed, so that the separation of the NMR signal of the desired fluid phase is realized.

2. Since the enhancement of DNP is related to a leakage factor of an observation nucleus and the presence of the relaxation reagent can weaken the relaxation effect of the free radical on the unselected fluid phase, the leakage factor related to DNP can be reduced and the enhancement of DNP in the non-selected fluid phase can be suppressed. Therefore, when the free radical is a non-selective free radical, the relaxation reagent can effectively suppress the DNP enhancement of the unselected fluid phase, and ensure the enhancement and separation of the NMR signal of the desired fluid phase.

3. The invention can further improve the signal-to-noise ratio of the NMR signal on the basis of achieving the purpose of separating the oil-water two-phase NMR signals, and the test time is short, no inversion calculation is required, and data processing is simple and easy.

DETAILED DESCRIPTION OF THE INVENTION

The invention will be described in detail below with reference to specific embodiments.

5# mineral oil and deionized water are used to prepare samples: equal volumes of 5# mineral oil and water are mixed and the mixture is rested for layering to obtain oil-water samples; TEMPO (tetramethylpiperidine oxynitride) is used as a non-selective free radical and $MnCl_2$ is selected as a relaxation reagent to enhance the relaxation of the water phase. DNP-NMR analysis and detection of all samples are performed on a 0.06 T DNP spectrometer.

Example 1

Figure 1:
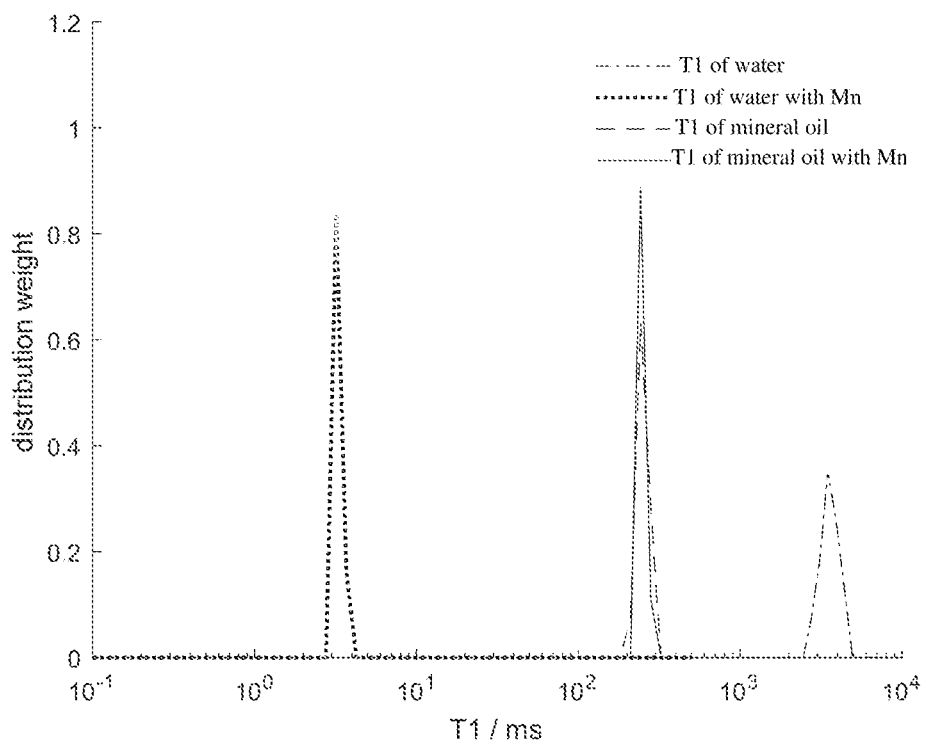
FIG. 1 illustrates a diagram showing the effect of a relaxation reagent $MnCl_2$ on relaxation of oil and water phases in an oil-water sample.
Figure 2:
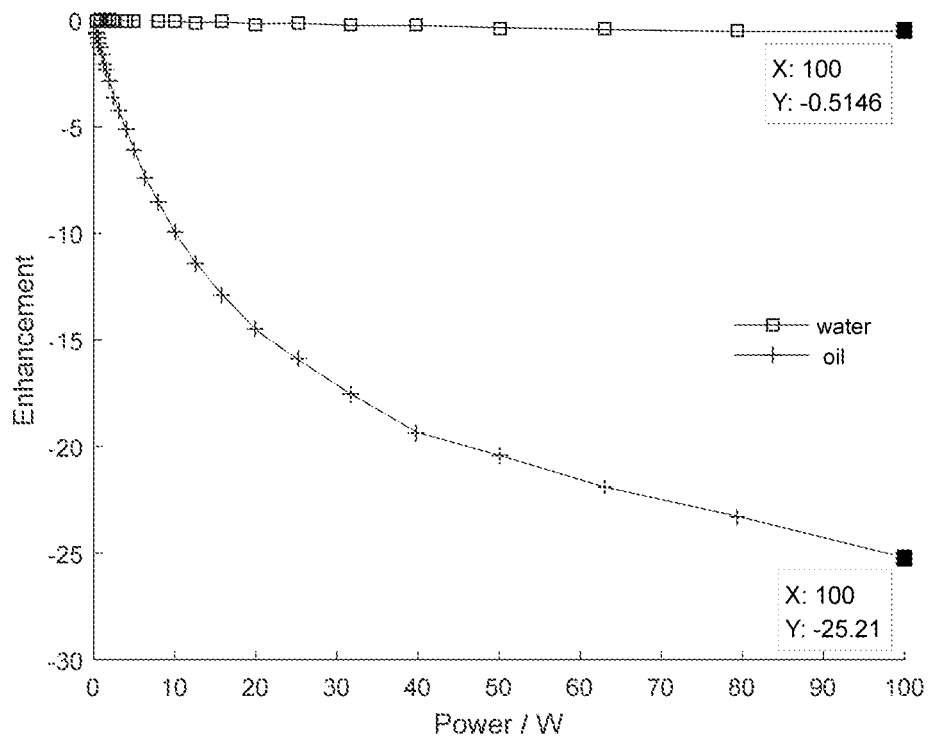
FIG. 2 illustrates a DNP enhancement effect diagram of oil and water phases in the pretense of both a relaxation reagent $MnCl_2$ and a non-selective free radical TEMPO.

1. $T_1$ distributions of oil and water phases in the oil-water sample are tested at a 0.06 T static magnetic field.
2. $MnCl_2$ is added to the oil-water sample and oscillated to be completely dissolved, and then rested for layering to obtain a mixed sample A. The concentration of $MnCl_2$ in the mixed sample A is 10 mM. $T_1$ distributions of oil and water phases in the mixed sample A are tested under a 0.06 T static magnetic field. The results of the two tests are shown in FIG. 1. From FIG. 1, it can be seen that before and after the addition of $MnCl_2$, the relaxation time of the oil phase remains unchanged, and the relaxation of the water phase changes from 3.5 s to 3.2 ms.
3. TEMPO is added to the mixed sample A and mixed evenly to obtain a mixed sample B. The concentration of TEMPO in the mixed sample B is 10 mM. The single pulse sequence with DNP is used to test the enhancement effects of the oil and water phases in the mixed sample B. The results are shown in the FIG. 2. From FIG. 2, it can be seen that the maximum DNP enhancement of the water phase is −0.5, that is, the signal intensity of the water phase is reduced. On the contrary, the DNP enhancement of mineral oil is much greater than that of the water phase, indicating that the coexistence of TEMPO and $Mn^{2+}$ can effectively suppress the DNP enhancement of the water phase, while the oil phase still has a larger DNP enhancement.

Example 2

Figure 3:
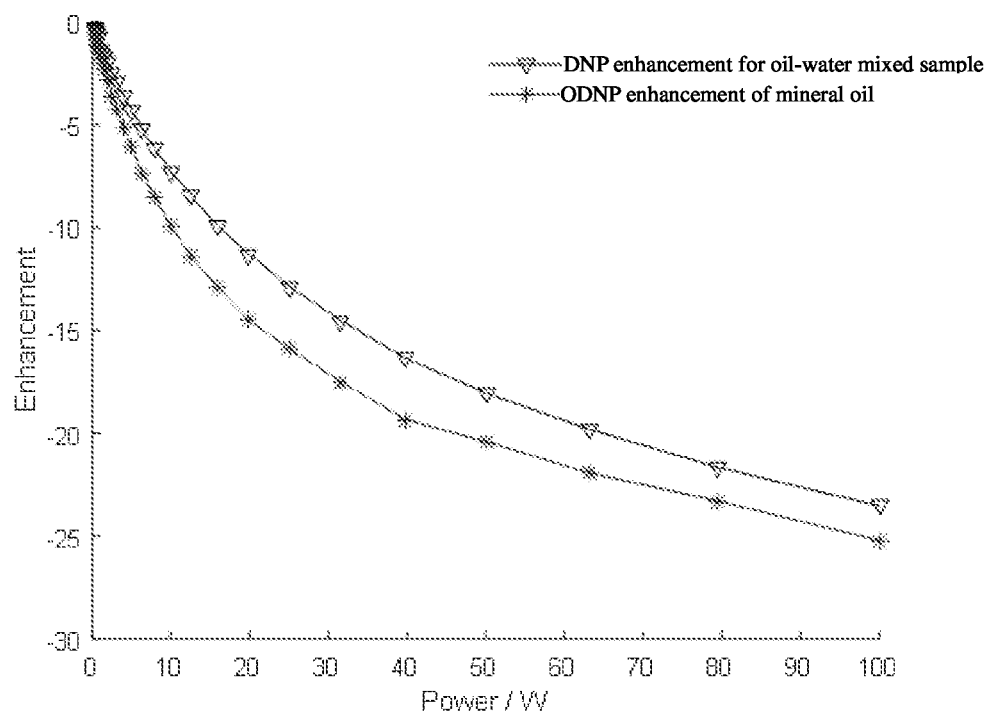
FIG. 3 illustrates a DNP enhancement effect diagram of an oil-water sample in the pretense of both a relaxation reagent $MnCl_2$ and a non-selective free radical TEMPO.
Figure 4:
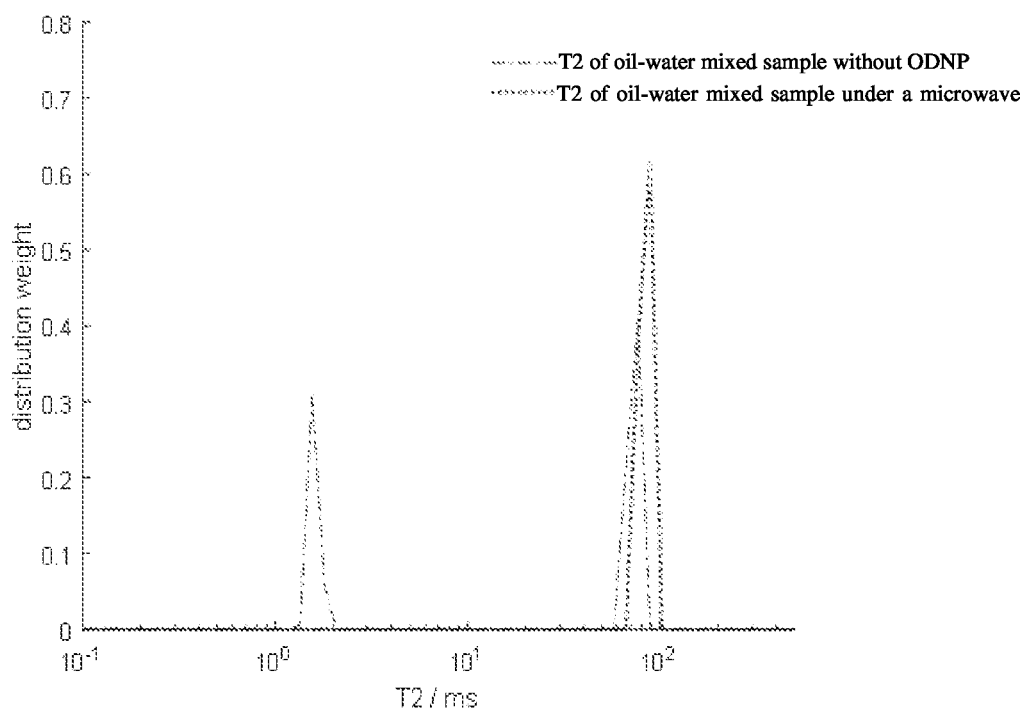
FIG. 4 illustrates T2 diagrams of an oil-water sample with and without DNP enhancement in the pretense of both a relaxation reagent $MnCl_2$ and a non-selective free radical TEMPO.

1. $MnCl_2$ and TEMPO are added to an oil-water sample and oscillated until $MnCl_2$ is completely dissolved, and then the resulting solution is rested for layering to obtain a mixed sample. The concentrations of $MnCl_2$ and TEMPO in the mixed sample are both 10 mM. The DNP single pulse sequence is used to test the DNP enhancement effect of the mixed sample, and the DNP enhancement effect of mineral oil tested by the DNP single pulse sequence is used as a reference. Results are shown in FIG. 3. From FIG. 3, it can be seen that the DNP enhancement of the mixed sample is similar to that of mineral oil, indicating that the signal of the water phase is suppressed, and the signal of the mixed sample after the enhancement is basically an NMR signal of the oil phase.
2. A CPMG sequence is used to test $T_2$ distributions of oil and water phases in the mixed sample under a microwave power of 10 W, and the $T_2$ distributions of the oil and water phases in the mixed sample without DNP enhancement are used as a reference. Results are shown in FIG. 4. From FIG. 4, it can be seen that the mixed sample exhibits oil-phase relaxation characteristics with the presence of DNP, which further indicates that the combination of TEMPO and $Mn^{2+}$ can separate the NMR signal of the oil phase from the mixed sample and selectively enhance the NMR signal of the oil phase.

Example 3

Figure 5:
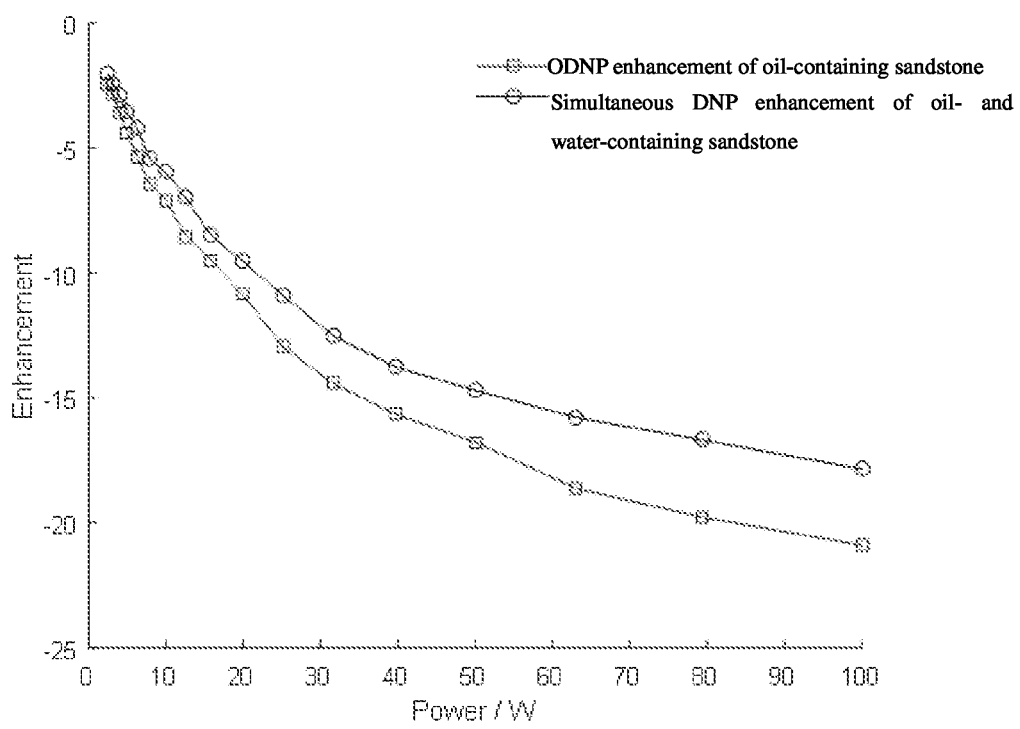
FIG. 5 illustrates a DNP enhancement effect diagram of oil-containing sandstone and oil-water-containing sandstone.

1. $MnCl_2$ and TEMPO are added to an oil-water sample and oscillated until $MnCl_2$ is completely dissolved, and then the resulting solution is rested for layering to obtain a mixed sample. The concentrations of $MnCl_2$ and TEMPO in the mixed sample are both 10 mM.
2. Two pieces of sandstones with a permeability of 100 md and a porosity of 10.9% are taken and separately soaked in oil and water phases of the mixed sample for more than 12 hours. Then, the excess liquid on the surfaces of the two pieces of sandstones is wiped off and the sandstones are weighed. The weight of the sandstone soaked in the water phase increases from 1062 mg to 1118 mg, and the water content is 54 mg; the weight of the sandstone soaked in the oil phase increases from 715 mg to 747 mg, and the oil content is 32 mg.
3. A DNP single pulse sequence is used to test the DNP enhancement effects of the oil-containing sandstone and the oil-water-containing sandstone (oil-containing sandstone and water-containing sandstone placed together) at the same time, and the DNP enhancement effect of the oil-containing sandstone tested by using the DNP single pulse sequence is used as a reference. Results are shown in FIG. 5. From FIG. 5, it can be seen that the DNP enhancement effects of the oil-containing sandstone and the oil-water-containing sandstone tested at the same time are similar to the DNP enhancement effect of the oil-containing sandstone. Even if the water content in the sandstone sample is higher than the oil content, it will have little influence on the enhancement of the oil-water-containing sandstone sample, which indicates that the NMR signal of the oil phase in the oil-water-containing sandstone sample can be directly separated by DNP-NMR.

Figure 6:
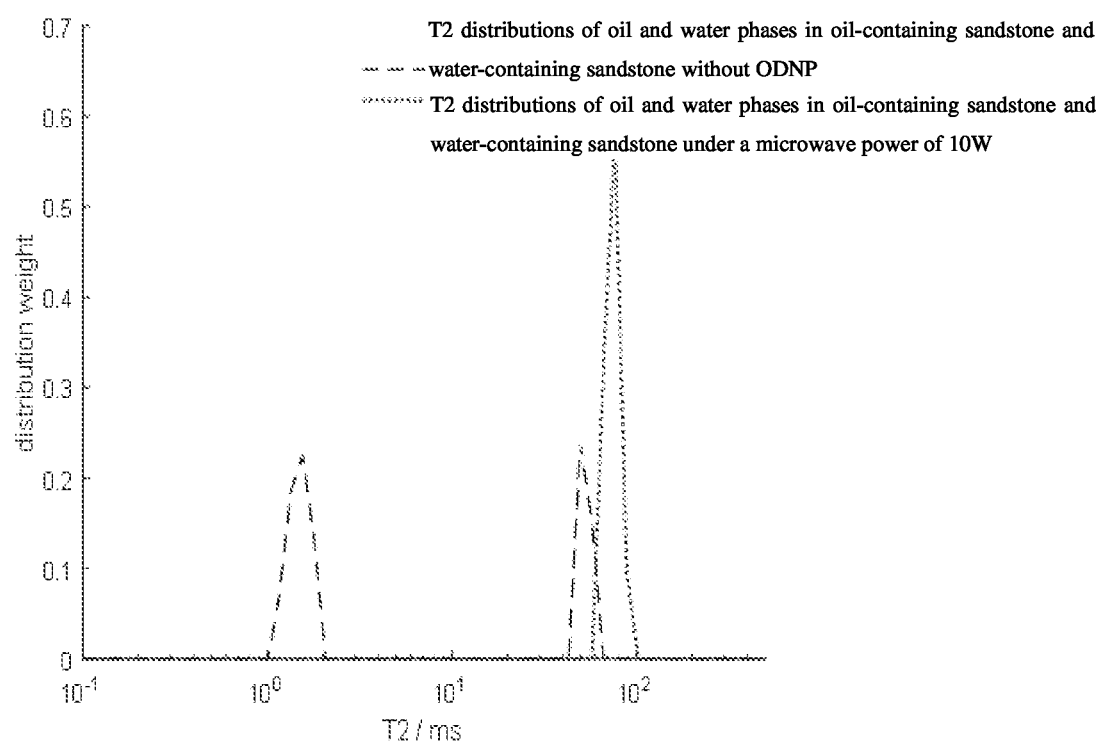
FIG. 6 illustrates $T_2$ distribution diagrams measured simultaneously for oil-water-containing sandstone with and without DNP enhancement.

4. A CPMG sequence is used to test $T_2$ distributions of oil and water phases in the oil-water-containing sandstone under a microwave power of 10 W, and the $T_2$ distributions of the oil and water phases in the oil-water-containing sandstone without DNP enhancement are used as a reference. Results are shown in FIG. 6. From FIG. 6, it can be seen that without ODNP enhancement, the relaxation distributions of the oil and water phases can be seen, while, only the $T_2$ distribution of the oil phase is obtained at the presence of microwave, which can further verify that the combination of DNP, a non-selective free radical, and a water-phase relaxation reagent can separate the NMR signal of the oil phase in the porous medium material.

What is claimed is:

1. A method for analyzing a two-phase sample based on dynamic nuclear polarization (DNP) based nuclear magnetic resonance (NMR), comprising:

preparing a sample for analysis, wherein the sample comprises an oil phase and a water phase, adding a composition to the sample, wherein the composition comprises a free radical and a relaxation reagent, the free radical non-selectively enhances NMR signals of the oil phase and the water phase under the dynamic nuclear polarization, and the relaxation reagent selectively enhances relaxation of either the oil phase or the water phase, thereby, suppressing the NMR signals of the oil or water phase with the enhanced relaxation under the dynamic nuclear polarization, measuring the NMR signals of the sample under dynamic nuclear polarization, wherein the NMR signals of the sample are similar to or basically same as the NMR signals of either the water phase or the oil phase alone, wherein the water phase or the oil phase does not have the enhanced relaxation by the relaxation reagent, analyzing the NMR signals of the sample to obtain characteristics of the water or oil phase in the sample.

2. The method according to claim 1, wherein the relaxation reagent selectively enhances the relaxation of the water phase, and the oil phase does not have the enhanced relaxation.

3. The method according to claim 1, wherein the free radical is tetramethylpiperidine oxynitride.

4. The method according to claim 1, wherein the relaxation reagent is $Mn^{2+}$.

* * * * *